United States Patent [19] [11] Patent Number: 5,532,105
Yamadera et al. [45] Date of Patent: Jul. 2, 1996

[54] PHOTOLITHOGRAPHICALLY VIAHOLE-FORMING PHOTOSENSITIVE ELEMENT COMPRISING TWO PHOTOSENSITIVE LAYERS FOR THE FABRICATION PROCESS OF MULTILAYER WIRING BOARD

[75] Inventors: Takashi Yamadera; Kazumasa Takeuchi; Ritsuko Obata, all of Tsukuba; Naoki Fukutomi, Yuki; Kazuko Suzuki, Tsukuba, all of Japan

[73] Assignee: Hitachi Chemical Company, Ltd., Japan

[21] Appl. No.: 103,873

[22] Filed: Aug. 9, 1993

[30] Foreign Application Priority Data

Aug. 7, 1992 [JP] Japan ................... 4-211385

[51] Int. Cl.⁶ .................. G03F 7/095; G03F 7/008; G03F 7/031/7/032
[52] U.S. Cl. .................. 430/156; 430/167; 430/197; 430/280.1; 430/281.1; 430/288.1; 430/311
[58] Field of Search ................... 430/197, 195, 430/167, 156, 281, 270, 280, 288, 311

[56] References Cited

U.S. PATENT DOCUMENTS

| 3,779,758 | 12/1973 | Polichette | 430/197 |
| 4,571,374 | 2/1986 | Vikesland | 430/156 |
| 4,839,261 | 6/1989 | Nakazaki et al. | 430/280 |
| 4,902,726 | 2/1990 | Hayashi et al. | 430/280 |

FOREIGN PATENT DOCUMENTS

| 52-14278 | 4/1977 | Japan . |
| 52-14279 | 4/1977 | Japan . |
| 52-14277 | 4/1977 | Japan . |
| 58-57776 | 4/1983 | Japan . |
| 62-248291 | 10/1987 | Japan . |
| 4-148590 | 5/1992 | Japan . |
| 4-180984 | 6/1992 | Japan . |

OTHER PUBLICATIONS

"Characteristic Features and Application of Surface Layer Printed Circuit Board (SLC)" [Electronic Materials pp. 103–108, Apr. 1991].
"Photopolymer Handbook" Compiled by Photopolymer Konwakai (Study Group); Published by Kogyo Chosakai (Industrial Research Committee); Published in 1989; Relevant pages: pp. 21–23 and pp. 245–247.

Primary Examiner—John S. Y. Chu
Attorney, Agent, or Firm—Pennie & Edmonds

[57] ABSTRACT

A photolithographically viahole-forming photosensitive element is formed of a light-transmitting base material and a photosensitive resin composition laminated as a layer on the light-transmitting base material. The photosensitive resin composition comprises:

(a) 100 parts by weight of a mixture comprising:
  (a-1) 10 to 90 parts by weight of a rubber,
  (a-2) 5 to 40 parts by weight of a phenol resin, and
  (a-3) 10 to 80 parts by weight of an epoxy resin;
(b) 1 to 10 parts by weight of an epoxy resin photoinitiator; and
(c) 1 to 10 parts by weight of an aromatic polyazide compound.

5 Claims, No Drawings

PHOTOLITHOGRAPHICALLY VIAHOLE-FORMING PHOTOSENSITIVE ELEMENT COMPRISING TWO PHOTOSENSITIVE LAYERS FOR THE FABRICATION PROCESS OF MULTILAYER WIRING BOARD

BACKGROUND OF THE INVENTION a) Field of the Invention

This invention relates to a photosensitive element which has photolithographically viahole-forming ability and good adhesion to plated copper and is suited for use in the fabrication of a multilayer wiring board. This invention is also concerned with a process for the fabrication of a multilayer wiring board.

b) Description of the Related Art

Keeping step with high densification of printed circuit boards in recent years, there is an increasing demand for so-called multilayer printed boards provided with a plurality of circuit layers. For the fabrication of a multilayer printed circuit, it has heretofore been the practice to press plural laminates, each of which carries wiring formed in advance thereon, together with a thermoserving insulating sheet interposed between each two adjacent laminates. This conventional fabrication process however requires ultimate care upon its practice, because it involves problems such as alignment and shrinkage of substrates. Conventional multilayer printed boards therefore tend to have high cost. With a view to overcoming such problems, it has been proposed, instead of relying upon the laminate-pressing step, to form an insulating layer on a first conductive pattern layer and then a second conductive pattern layer on the insulating layer, that is, so-called stacked multilayer circuit boards have been proposed.

For the connection between layers in such a printed circuit board, a newly-developed interlayer connecting technique is adopted besides the conventionally-practiced, interlayer electrical connection making use of through-holes. The newly-developed interlayer connecting technique is a connecting technique of the non-through-hole type. According to this technique, holes are drilled in each insulating layer until the drills nearly extend through the insulating layer. As a further substitute, an excimer laser boring technique has been proposed recently.

These interlayer connecting techniques are of the non-through-hole types and holes are arranged only at locations needed between layers. It is hence possible to increase the freedom in the layout of wiring, thereby contributing toward a reduction in the number of layers in a multilayer circuit board and also high densification of a printed circuit board.

However, the interlayer connecting techniques which have been adopted to date fundamentally require successive formation of holes. The fabrication cost therefore increases with the number of holes. A multilayer board obviously requires many holes for the connection between layers. In high-density products, it is not rare that more than 10,000 holes are needed per board. The cost required for this drilling work is one of major causes for the high fabrication cost of multilayer wiring boards.

In meantime, so-called photolithographic viahole technique was proposed. According to this technique, all connecting holes are formed together at once by photolithography. This photolithographic viahole technique applies photolithographic processing, which is used primarily upon formation of conductive patterns (namely, a photosensitive resin layer is exposed and developed at desired locations to provide an etching resist or a plating resist), to interlayer insulating films. Because it photographically forms all holes at once, the fabrication cost is irrelevant to the number of holes. Further, small-diameter viaholes, whose formation is extremely difficult when drills are used, can be formed precisely. The photolithographic viahole technique is therefore considered to be most promising as an interlayer connecting technique. Multilayer printed boards with viaholes photolithographically formed using a photosensitive epoxy resin are disclosed, for example, in the article entitled "Characteristic Features and Application of Surface Layer Printed Circuit Board (SLC)" ("Electronic Materials", 103–108, April 1991) and also in Japanese Patent Application Laid-Open (Kokai) No. HEI 4-148590.

Further, Japanese Patent Application Laid-Open (Kokai) No. HEI 4-180984 discloses examples of additive adhesive films containing an epoxy resin photoinitiator, that is, a photopolymerization initiator for epoxy resins. The additive adhesive films exemplified in this patent publication however do not contain any photocrosslinking agent for rubber so that no good image can be formed even when they are exposed to ultraviolet rays of high intensity.

In addition to the availability of a multilayer composite structure without any pressing step as described above, stacked multilayer circuit boards also have such advantages that small-diameter viaholes can be formed and a microcircuit can be formed. To progressively form circuitry by the stacking technique, however, it is indispensable to provide each conductive pattern by forming a conductor on an interlayer insulating film in accordance with an electroless plating process. Each conductive pattern so formed is also required to have sufficient adhesion with a substrate as expressed typically in terms of peel strength. Accordingly, an insulating material required as each interlayer insulating film for the stacking technique is needed to have formability of images such as viaholes, resistance to an electroless plating solution, and adhesion to plated copper.

Electroless plating solution resistant adhesives have been used for many years as additive adhesives and are composed primarily of a rubber material. For example, Japanese Patent Application hid-Open (Kokai) Nos. SHO 58-57776 and SHO 62-248291 disclose some examples composed primarily of an epoxy resin, a synthetic rubber and a phenol resin. In addition, Japanese Patent Application Laid-Open (Kokai) No. HEI 4-180984 discloses film-shaped adhesives which contain an epoxy resin, a synthetic rubber, a phenol resin, a chemical plating catalyst and a photosensitive aromatic onium salt. These illustrative adhesives show excellent roughening properties when treated with a roughening solution, and have good adhesion to plated copper, for example, peel strength higher than 2 kgf/m. However these materials do not have photosensitivity and, obviously, do not permit photolithographic formation of viaholes.

On the other hand, as heat-resistant resist materials, many examples are known as photosensitive solder masking materials or photoadditive materials. These illustrative materials are photosensitive materials inherently so that they are excellent in image forming ability and electroless plating solution resistance. They however have extremely poor adhesion to copper plated in an electroless manner. They are also accompanied by such a drawback that no sufficient roughening can be achieved even when treated by a roughening solution. Although they may have property as resists in an additive process, they are practically unusable as additive adhesives, namely, as interlayer insulating films upon photolithographic formation of viaholes.

The adhesives referred to above by way of example permit roughening when a special roughening solution is used, and show some improvements in the adhesion to plated copper. Their peel strength is however reported to be 1.0 Kg or less. Their adhesion is still insufficient especially in the outermost layer.

To be useful in stacked multilayer printed circuits, an insulating material is required to have photolithographic viahole forming ability, heat resistance, plated copper precipitating ability, and adhesion to plated copper. Under the circumstances, there is no photosensitive material that meets all the above requirements and can provide multilayer wiring boards with sufficient reliability.

SUMMARY OF THE INVENTION

An object of the present invention is provide a novel photosensitive material having the above-described various properties and also to provide a photolithographically viahole-forming photosensitive element which makes it possible to easily use the photosensitive material in the fabrication of printed circuit boards.

The present invention therefore provides a photolithographically viahole-forming photosensitive element comprising a first photosensitive resin composition layer and a second photosensitive resin composition stacked together as first and second layers, said first photosensitive resin composition enabling formation of an image by radiation, permitting formation of a fine pattern on the surface by a roughening solution and also allowing a conductor to precipitate by a method such as electroless plating, and said second photosensitive resin composition having high electroless plating solution resistance and excellent insulating property.

In the photolithographically viahole-forming photosensitive element according to the present invention, the first photosensitive resin layer permits formation of an image and, when roughened subsequently, can provide a good roughened surface and hence high adhesion to copper to be plated.

The second photosensitive resin layer serves to form an image and, together with the first photosensitive resin layer, to photolithographically form viaholes, has high electroless plating solution resistance and insulating property, and contributes primarily to improvements in the insulating performance of the formed multilayer wiring board. In particular, the film thickness can be set as desired to provide sufficient interlayer insulating property and improved electrolytic corrosion resistance. The first photosensitive resin layer can contain a filler kneaded in to improve the roughening property. The filler however reduces the transmissibility of radiation, thereby making it impossible to increase the thickness of the first photosensitive resin layer beyond a certain limit. The second photosensitive resin layer imparts insulating property sufficient to supplement any deficiency in insulating property of the first photosensitive resin layer. Stacking of these two photosensitive resin layers permits free design of a multilayer wiring board which has overcome the various problems described above.

The stacked structure makes it possible to impart optimal properties to each photosensitive resin layer, thereby making it possible to obtain a stacked multilayer wiring board through simple steps by a photolithographic viahole-forming technique although it has heretofore been difficult to obtain such a stacked multilayer wiring board by any photolithographic viahole-forming technique.

In a first aspect of the present invention, there is thus provided a photolithographically viahole-forming photosensitive element formed of a light-transmitting base material and a first photosensitive resin composition laminated as a first layer on the light-transmitting base material, wherein said first photosensitive resin composition comprises:

(a) 100 parts by weight of a mixture comprising:

(a-1) 10 to 90 parts by weight of a rubber, (a-2) 5 to 40 parts by weight of a phenol resin, and (a-3) 10 to 80 parts by weight of an epoxy resin;

(b) 1 to 10 parts by weight of an epoxy resin photoinitiator; and (c) 1 to 10 parts by weight of an aromatic polyazide compound.

The first photosensitive resin composition can further comprise (d) 5 to 40 parts by weight of a filler as needed. The photolithographically viahole-forming photosensitive element can further comprise a second photosensitive resin composition laminated as a second layer on the first layer. The second photosensitive resin composition can comprise:

(e) 100 parts by weight of a mixture comprising:

(e-1) 20 to 80 parts by weight of a film-forming polymer, and (e-2) 20–80 parts by weight of an ethylenically-unsaturated monomer; and (f) 1 to 10 parts by weight of a photopolymerization initiator.

In a second aspect of the present invention, there is also provided a photolithographically viahole-forming photosensitive element formed of a light-transmitting base material and a first photosensitive resin composition laminated as a first layer on the light-transmitting base material, wherein said first photosensitive resin composition comprises:

(a) 100 parts by weight of a mixture comprising:

(a-1) 10 to 90 parts by weight of a rubber, (a-2) 10 to 90 parts by weight of an epoxy resin, and (a-3) 0 to 60 parts by weight of an acrylic resin;

(b) 1 to 10 parts by weight of an aromatic polyazide compound;

(c) 1 to 80 pats by weight of a heat-curable crosslinking agent; and (d) 0 to 10 parts by weight of a thermo-polymerization initiator.

The first photosensitive resin composition can further comprises (e) 5 to 40 parts by weight of a filler as needed. The photolithographically viahole-forming photosensitive element can further comprise a second photosensitive resin composition laminated as a second layer on the first layer. The second photosensitive resin composition can comprise:

(f) 100 parts by weight of a mixture comprising:

(f-1) 20 to 80 parts by weight of a film-forming polymer, and (f-2) 20–80 parts by weight of an ethylenically-unsaturated monomer; and (g) 1 to 10 parts by weight of a photopolymerization initiator.

Use of a photolithographically viahole-forming photosensitive element according to this invention makes it possible to precisely fabricate a high-density multilayer wiring board, in which conductive pattern layers are interconnected by viaholes formed in a photolithographic manner, through simple steps of film stacking, exposure and development. In the multilayer circuit board so obtained, copper obtained by electroless plating has sufficiently high adhesion strength and also sufficiently high dielectric breakdown voltage. The present invention can therefore fabricate multilayer wiring boards having high reliability.

DETAILED DESCRIPTION OF THE INVENTION AND PREFERRED EMBODIMENTS

In the photolithographically viahole-forming photosensitive element according to the first aspect of this invention, the rubber component of the first photosensitive resin composition imparts film-forming ability upon fabrication of the photosensitive element so that a flexible thin film can be formed. In addition, the rubber component is selectively caused to react by roughening treatment in a subsequent step so that a fine pattern is formed on a surface of the adhesive. Preferred examples of the rubber component include natural rubber, butadiene-nitrile rubber, isoprene-nitrile rubber, butadiene-styrene rubber, isoprene-styrene rubber, acrylonitrile-butadiene rubber, isoprene-containing acrylonitrile-butadiene rubber, carboxyl-containing acrylonitrile-butadiene rubber, and an epoxy-containing acrylonitrile butadiene rubber. The rubber component is added in an amount of 10 to 90 parts by weight, more preferably 30 to 70 parts by weight per 100 parts of the resin mixture.

In the first photosensitive resin composition, the epoxy resin component is added to improve the heat resistance and electrical properties of the hardened layer. Usable examples of the epoxy resin includes epoxy resins of the bisphenol, novolak, cresol novolak and aliphatic epoxy resins. These epoxy resins can be used either singly or in combination. Of these examples, a bisphenol epoxy resin whose epoxy equivalent falls within a range of from 200 to 2,100 (g/equivalent) is more preferred from the standpoints of heat resistance and insulating property. The epoxy resin component is added in an amount of 10–80 parts by weight per 100 parts by weight of the resin mixture.

The phenol resin employed in the first photosensitive resin composition is used primarily to improve the heat resistance of the cured product. A phenol resin which can react with the rubber component is particularly desired. Usable examples of the phenol resin includes "Hitanol 2380" and "Hitanol 2400" (trade names; both, products of Hitachi Chemical Co., Ltd.) as resol phenol resins as well as alkyl-modified phenol resins, cashew-modified phenol resins, and novolak phenol resins. The phenol resin is added in an amount of 5 to 40 parts by weight per 100 parts of the resin mixture.

Usable examples of the epoxy resin photoinitiator employed in the first photosensitive resin composition include the aromatic onium salts disclosed in Japanese Patent Publication (Kokai) No. SHO 52-14277, the aromatic onium salts disclosed in Japanese Patent Publication (Kokai) No. SHO 52-14278 and the aromatic onium salts disclosed in Japanese Patent Publication (Kokai) No. SHO 52-14279. Their specific examples include triphenylsulfonium hexaantimonate and diphenyliodonium tetrafluoroborate. They can be used either singly or in combination. The epoxy resin photoinitiator is added in an amount of 0.1 to 10 parts by weight per 100 parts by weight of the resin mixture.

The rubber photocrosslinking agent employed in the first photosensitive resin composition is used to induce primarily photocrosslinking of the rubber component and the phenol resin component in the adhesive composition. As is described, for example, on pages 21 to 23 and 245 to 247 of "Photopolymer Handbook", compiled by Photopolymer Konwakai (Study Group) and published by Kogyo Chosakai (Industrial Research Committee) in 1989, the crosslinking agent is added and/or inserted to double bonds and/or carbon-hydrogen bonds in the rubber component so that the rubber component is three-dimensionally cured. The photocrosslinking agent therefore contributes to the formation of an image. As a rubber component amounts to a rather substantial percentage of each additive adhesive employed to date, it is impossible to form a good image without addition of such a rubber crosslinking agent.

Illustrative usable photocrosslinking agents include azide compounds and photoradical initiators. Of these, aromatic polyazide compounds are excellent in reactivity and bring about good results. Exemplary usable aromatic polyazide compounds includes 2,6-bis( 4,4'-azidobenzal)cyclohexanone, 2,6-bis(4,4'-azidobenzal)methylcyclohexanone, 3,3'-diazidodiphenylsulfone, 4,4'-diazidostilbene, 4,4'-diazidochalcone, and 3,3'-dimethoxy-4,4'-diazidobiphenyl.

Although the amount of the rubber photocrosslinking agent is dependent upon the amount of the rubber component, it is suitable to add the photocrosslinking agent in an amount of 0.1 to 10 parts by weight.

The amount of the photocrosslinking agent is determined of course from the viewpoint of improving the sensitivity of the photosensitive resin composition. In the case of the first photosensitive resin composition, in particular, it is also important to determine its amount from the viewpoint of allowing an appropriate quantity of light to transmit to the second photosensitive resin composition in the second layer.

In the photolithographically viahole-forming photosensitive element according to the second aspect of the present invention, the resin components contained in the first photosensitive resin composition may preferably be those modified by a carboxyl-containing compound so that their solubility in a water-base developer can be improved.

Usable examples of the rubber component include carboxylic-acid-modified rubbers obtained by adding maleic anhydride or tetrahydrophthalic anhydride to unsaturated bonds of natural rubber, butadiene-nitrile rubber, isoprene-nitrile rubber, butadiene-styrene rubber, acrylonitrile-butadiene rubber and isoprene-styrene rubber. In a simpler manner, a carboxylic-acid-modified rubber can be obtained by using a maleic-acid-modified polybutadiene as a starting material and acrylating or methacrylating maleic acid moieties of the maleic-acid-modified polybutadiene. Such carboxylic-acid-modified rubbers include the MAC-type, MM-type and M-type of polybutadiene (LPB), all, products of Nippon Petrochemicals Co., Ltd. These carboxylic-acid-modified rubbers have an acid value in a range of from 20 to 120, preferably from 20 to 80. These carboxylic-acid-modified rubbers are soluble in a water-base developer and, owing to the combined use with a light-curable crosslinking agent such as a bisazide compound, can form an image. In addition to the carboxylic-acid-modified rubbers described above, unmodified rubbers can also be used in combination. In this case, combined use of a rubber having the property that it can be effectively formed into a fine pattern in the roughening step can enhance the adhesion strength of plated copper. The rubber component is added in an amount of from 10 to 90 parts by weight, preferably from 20 to 60 parts by weight per 100 parts by weight of the resin mixture.

Usable examples of the epoxy resin component include those obtained by modifying epoxy resins of the bisphenol type, the novolak type, the cresol novolak type, the alicyclic type or the like with a carboxylic acid.

To modify with a carboxylic acid, maleic anhydride or tetrahydrophthalic anhydride can be added. In the photosensitive resin composition according to the present invention, it is desired, in view of the stability when mixed with the other resin components, to use such a modified epoxy resin as obtained by modifying a low-molecular epoxy resin of the bisphenol type with a carboxylic acid. Specific examples include those obtained by modifying "Ep1001", "Ep1004", "Ep1007" and "Ep1010" (trade names; products of Yuka Shell Epoxy Kabushiki Kaisha) and the like with maleic acid or tetrahydrophthalic acid. These carboxylic-acid-modified epoxy resins are soluble in a water-base developer and, owing to the combined use with the aromatic polyazide compound such as a bisazide compound, can form an image. These carboxylic-acid-modified epoxy resins have an acid value in a range of from 10 to 160, preferably from 10 to 80. The epoxy resin component is added in an amount of from 10 to 90 parts by weight, preferably from 30 to 80 parts by weight per 100 parts of the resin mixture.

An acrylic resin can also be used in the photosensitive resin composition of the present application to impart film-forming property and hence to facilitate formation of a flexible thin film upon fabrication of the photosensitive element. Illustrative acrylic resins include copolymers obtained by polymerizing monomers such as methacrylic acid, methacrylate esters, acrylic acid and acrylate esters. The acrylic resin has the advantage that its composition can be set substantially as desired. In the present invention, it is desired to synthesize acrylic resins at varied monomer ratios by adjusting the content of a carboxylic acid. This allows to adjust the solubility of the acrylic resin in a water-base developer. An illustrative monomer ratio include methyl methacrylate/butyl acrylate/methacrylic acid=75/15/10. To impart light-curable property, maleic acid or tetrahydrophthalic acid can also be introduced to include double bonds. Such acrylic resins can be rather readily synthesized by adding maleic acid or tetrahydrophthalic acid to hydroxyl-containing monomers. These acrylic resins have an acid value in a range of from 0 to 40, preferably from 0 to 20. It is also possible to use an oligomer as long as it can impart film-forming properties. Illustrative of such an oligomer include a trimethylhexanemethylene diisocyanate urethane acrylate oligomer.

When such an acrylic resin is used, it can be added in an amount of from 10 to 60 parts by weight, preferably from 10 to 40 parts by weight.

Upon mixing the resin components, it is important to control the acid value of the overall resin composition. An unduly low acid value makes it difficult to develop the resulting resin composition in a water-base developer. An excessively high acid value, on the other hand, results in a reduction in plating solution resistance and electrolytic corrosion resistance. The preferred acid value of the photosensitive resin composition can range from 10 to 120, with a range of from 10 to 80 or so being particularly preferred.

The aromatic polyazide compound serves to optically crosslink the carboxylic-acid-modified rubber, the carboxylic-acid-modified epoxy resin and the carboxylic-acid-modified acrylic resin in the photosensitive resin composition according to the present invention, whereby a hardened film is formed. Among aromatic polyazide compounds, aromatic bisazide compounds can be used preferably. Illustrative aromatic bisazide compounds include 2,6-bis(4,4'-azidobenzal)-cyclohexanone, 2,6-bis(4,4'-azidobenzal)methylcyclohexanone, 3,3'-diazidodiphenylsulfone, 4,4'-diazidostilbene, 4,4'-diazidochalcone, and 3,3'-dimethoxy- 4,4'-diazidobiphenyl.

Illustrative of the heat-curable crosslinking agent include melamines, bismaleimides, cyanate esters, dicyanediamides- Among these, bismaleimides and cyanate esters are desired in heat resistance and curing speed under heat. Like other epoxy resins, dicyanediamides can also be used in the present invention. Exemplary bismalelmides include, in addition to bis(p-maleimidylphenyl)methane, bis(m-maleimidylphenyl)methane, p,m'-bis(maleimidylphenyl)methane, bis(p-maleimidylmethylphenyl)methane and bis(p-maleimidyldiethylphenyl)methane. Besides, there are also bismaleimides synthesized by using aromatic diamines each of which has been formed by bonding aromatic rings together via a sulfone, sulfone ether, ether or ether-ketone group. Further, bismaleimides obtained by coupling plural aromatic rings to diphenylmethanes via a sulfone, sulfone ether, ether or ether-ketone group are desired for their improved solubility. Such bismaleimides include, for example, 2,2-bis(p-maleimidylphenoxyphenyl)propane and the like. Illustrative eyanate esters include triazine-type prepolymers available from monomers such as bisphenol A dicyanate, tetramethylbisphenol A dicyanate and hexafluorobisphenol A dicyanate. Described specifically, "B-40S", "M-40S" and "F-40S" (trade names; product of Ciba-Geigy AG) and the like can be used.

Depending on the heat-curable crosslinking agent employed, it may be desired to use a thermopolymerization initiator in combination. When a bismaleimide is used, use of a thermopolymerization initiator may be indispensable depending on the heat-curing temperature. As the thermopolymerization initiator, an organic peroxide can be used. Although a suitable organic peroxide can be chosen in view of the heat-curing temperature and storage conditions for the photosensitive element of this invention, one having a higher decomposition temperature is preferred. Illustrative organic peroxides include methyl ethyl ketone peroxide, dicumyl peroxide, 2,5-dimethyl-2,5-di(t-butylperoxy)-hexane, $\alpha,\alpha'$-bis(t-butylperoxy-m-isopropyl)benzene, t-butylcumyl peroxide, isopropylbenzene hydroperoxide, di-t-butyl peroxide, p-methanehydroperoxide, 2,5-dimethyl- 2,5-di(t-butylperoxy)hexyne-3,1,1,3,3-tetramethylbutyl hydroperoxide, and 2,5-dimethylhexane-2,5-dihydroperoxide In practice, "Perhexyne 25B", "Percumyl D", "Perhexa 3M", "Perhexa 25B", "Permec N", "Perbuthyl O" and "Perbutyl Z (trade names, product of Nippon Oil and Fats Co., Ltd.), etc. can be used.

The photosensitive element according to this invention has been imparted with both light-curability and heat-curability. Subsequent to the photolithographic formation of viaholes or the like by exposure and development, it is necessary to conduct poet light-curing and heat-curing. The heat-curing temperature and time are determined by the properties of the compounds employed as the heat-curable crosslinking agent and the thermopolymerization initiator. The temperature can range from 100° C. to 200° C., preferably from 100° C. to 180° C.

In the photolithographically viahole-forming photosensitive element according to each of the first and second aspects of the present invention, it is preferred to add a filler to the first photosensitive resin composition. The filler is effective in imparting mechanical strength and heat resistance to the cured film and, at the same time, in applying a fine pattern to the surface of the first layer of the first photosensitive resin composition because it is dissolved and eliminated by a roughening solution.

Exemplary usable fillers include calcium carbonate, magnesium carbonate, calcium silicate, zirconium silicate, titanium oxide, magnesium oxide, zinc oxide, calcium hydroxide, aluminum hydroxide, silica, and talc. These fillers can be used either singly or in combination. A portion of the filler may serve as a vulcanizing agent or aid.

A plating catalyst may be incorporated in the first photosensitive resin composition. The plating catalyst acts as nuclei when electroless plating is conducted. When such a plating catalyst has been added beforehand in the element, the plating catalyst serves to further enhance the adhesion strength of copper to be plated.

Usable plating catalysts include particles of metals such as Pd, particles of compounds such as chlorides, and those obtained by either adsorbing or mixing them on or in inorganic substances or organic substances.

In the photolithographically viahole-forming photosensitive elements according to the first and second aspects of the present invention, the same photosensitive resin composition can be used commonly as both the first and second photosensitive resin compositions.

The second photosensitive resin composition layer is provided to improve the image forming ability of the photolithographically viahole-forming photosensitive element and also to improve the electrical insulation between the layers. No special composition or property is therefore needed, so that various image-forming photosensitive resins which have been used conventionally can be used. However, the second photosensitive resin composition layer is also included in the basic structure so that heat resistance and reliability are required. In view of these, the second photosensitive resin composition is desired to have a permanent resist composition.

The second photosensitive resin composition layer is required, like the first photosensitive resin composition layer, to retain a stable film as a photosensitive element on the light-transmitting base material. For this purpose, the second photosensitive resin composition contains the film-forming polymer. The amount of the film-forming polymer is from 20 to 80 parts by weight, preferably 30 to 70 parts by weight per 100 parts of the resin mixture.

No particular limitation is imposed on the type of the film-forming polymer used in the second photosensitive resin composition. A suitable film-forming polymer is selected from the viewpoints of the heat resistance, electrical characteristics, image forming ability and developability, etc.

Illustrative of the film-forming polymer used in the second photosensitive resin composition include vinyl polymers and/or vinyl copolymers such as polystyrene, polyvinylbutyral, ethylene/vinyl acetate copolymer, polyvinylphenol, styrene-maleic anhydride copolymer; acrylic polymers such as polymethyl methacrylate, methyl methacrylate-mathacrylic acid copolymer, polymer or copolymer of methacrylate esters or acrylate esters, and copolymers of methacrylate esters and/or acrylate esters and methacrylic acid and/or acrylic acid; polycarbonates; phenoxy resins; novolak phenol resins; styrene-butadiene resins; etyrene-isoprene resins; and chroman-indene resins.

The ethylenically-unsaturated monomer employed in the second photosensitive resin composition is required to impart as a plasticizer an appropriate level of flexibility so the photosensitive element before curing but, after curing, to impart various properties such as heat resistance and mechanical properties to the second photosensitive resin composition layer together with the film-forming resin. The ethylenically-unsaturated monomer is added in an amount of from 20 to 80 parts by weight, preferably from 25 to 75 parts by weight per 100 parts of the second photosensitive resin composition.

As the ethylenically-unsaturated monomer employed in the second photosensitive resin composition, it is preferred to choose one of various acrylate monomers primarily in view of their good polymerizability. These acrylate monomers include various acrylate ester monomers, methacrylate ester monomers and mixtures thereof. They allow to adjust various properties such as branching degree, molecular weight and viscosity and are particularly preferred.

Examples of these preferred ethylenically-unsaturated monomers include commercial acrylate monomers or methacrylate monomers such as "A-TMPT", "A-TMM3A-4G", "A-9G", "A-14G", "TMPT", "4G", "9G", "14G", "BPE-4" and "BPE-10" (trade names; all, products of Shin-Nakamura Chemical Co., Ltd.); "Viecoat #540" and "Viscoat #700" (trade names; products of OSAKA ORGANIC CHEMICAL INDUSTRY LTD.); 1,6-hexanol diacrylate; and trimethylhexane diisocyanate-hydroxyethyl acrylate adduct.

No particular limitation is imposed on the photopolymerization initiator employed in the second photosensitive resin composition. Any photopolymerization initiator can therefore be used insofar as it can initiate photopolymerization of the ethylenically-unsaturated monomer. The type and amount of the photopolymerization initiator are determined in view of its absorptivity coefficient and absorption peak position. In general, however, the photopolymerization initiator is used in an amount of from 0.1 to 10 parts by weight, preferably from 0.2 to 7 parts per 100 parts by weight of the resin mixture.

Examples of usable photopolymerization initiators include benzophenone, p,p'-diethylaminobenzophenone, benzoin isopropyl ether, benzil, benzil dimethylacetal ("Irgacure 651", trade name; product of Ciba-Geigy AG), "Irgacure 184" and "Irgacure 906" (trade names; both, products of Ciba-Geigy AG), diethylthioxanthone, camphorquinone, p-dimethylaminochalcone, and carbonyl bis-(diethylaminocoumalin).

The photopolymerization initiator can be used in combination with an aid or additive which promotes the initiation reaction. Illustrative additives include triethanolamine, isoamyl diethylaminobenzoate, N-phenylglycine, and N-methyl-N-phenylglycine.

These photosensitive resin compositions can be added with other additives for various purposes. Examples of such additives include various polymerization inhibitors, antioxidants, dyes, pigments, flame retardants, thickeners, adhesion improvers, anti-plating solution agents, and fluorescent agents.

It is the common practice to apply a photolithographically viahole-forming photosensitive resin composition onto a substrate which carries a circuit formed beforehand on an insulating substrate. The substrate may however be a simple insulating substrate without such a circuit or a substrate with a conductor formed over the entire surface thereof. To apply the resin composition, a conventional film-forming technique such as knife coating, curtain coating, dip coating or spin coating can be used. After the coating, the resin composition Is dried to allow the solvent to evaporate so that a uniform film of the photosensitive adhesive is formed.

The thickness of the photosensitive adhesive film is determined primarily from the standpoint that a sufficient level of reliability be assured with respect to the interlayer insulation. An unduly thin photosensitive adhesive film leads to insufficient withstanding of a voltage. On the other hand, an excessively large film thickness results in an increase in the thickness of the resulting multilayer wiring board and also in a drop in resolution. From these viewpoints, the film thickness is set in a range from 10 μm to 100 μm, preferably from 15 μm to 70 μm. In connection with this film thickness, no particular limitation is imposed on the thickness of the first layer of the first photosensitive resin composition, but an excessively thin layer leads to insufficient roughening while an unduly thick layer deleteriously affect the resolution. It is therefore desired to set the thickness of the first layer normally at 5 µm to 50 µm, preferably at 10 µm to 50 µm. The remaining thickness is the thickness of the second layer of the second photosensitive resin composition.

The photolithographically viahole-forming photosensitive element is supplied together with a light-transmitting base material having excellent dimensional stability such as a PET (polyethylene terephthalate) film. In general, this element is laminated further with a protective film such as a polyethylene film. As has been described above, the photosensitive element according to the present invention has the structure that the light-transmitting base material, the first layer of the first photosensitive resin composition, the second layer of the second photosensitive resin composition, and the protective film are stacked successively one over the other. The protective film is removed from the photolithographically viahole-forming photosensitive element before the element is stacked on a conductive pattern layer. The lamination of the first and second layers of the first and second photosensitive resin compositions can be achieved by coating the resin compositions as varnishes or bonding them as films.

The photolithographically viahole-forming photosensitive element is usually laminated on a substrate by a laminator which is equipped with heating and pressing means. For this purpose, laminatore equipped with means such as hot rolls, a substrate transporting system, a photosensitive element feeder and vacuuming means are marketed by various companies and can be used without any particular modification.

The light-transmitting base material attached to the photolithographically viahole-forming photosensitive element is removed from the element after the lamination of the element on the substrate and either before or after exposing the element to photolithographically form viaholes.

It is important in view of automation of the fabrication steps that the light-transmitting base material can be removed with light force from the photolithographically viahole-forming photosensitive element. For this purpose, it is desired that the adhesion strength between the first layer of the first photosensitive resin composition, with which the light-transmitting base material is maintained in direct contact, and the light-transmitting base material is small. To attain this purpose, care must therefore be exercised upon selection of the base material.

A suitable light-transmitting base material is selected from such viewpoints that the base material does not interfere with transmission of radiation required for the formation of an image and has strength sufficient to withstand heat and tension to be applied upon fabrication of the photolithographically viahole-forming photosensitive element and during the lamination step to the substrate.

Usable examples of the light-transmitting base materials generally include polyester films such as polyethylene terephthalate and polybutylene terephthalate films, polyolefin films such as stretched polypropylene films, and polystyrene films. Although no particular limitation is imposed on the thickness of the base material, an unduly small thickness fails to support tension applied upon fabrication or lamination so that the base material develops problems such as stretching and/or wrinkling. An excessively large thickness, however, leads to a drop in resolution and also to a problem in allowing the element to penetrate into the substrate. With the foregoing in view, the thickness of the light-transmitting base material is generally selected from a range of 7 micrometers to 100 micrometers, preferably from 10 micrometers to 30 micrometers.

As a measure for reducing the force required upon peeling off the base material, it is extremely effective to apply parting treatment beforehand to one side of the base material, said side being brought into contact with the first layer of the first photosensitive resin composition. As a parting agent for the above parting treatment, various known materials can be used, including silicone materials, TEFLON materials and paraffin materials. It is desired to choose a suitable parting agent so that the parting agent does not move to the first layer of the first photosensitive resin composition.

As a substrate on which the photolithographically viahole-forming photosensitive element is to be laminated, one of substrates which have conventionally been used upon fabrication of printed circuit boards can be used as is. Illustrative substrates include glass-epoxy resin laminates, glass-polyimide laminates, paper-epoxy resin laminates, paper-phenol resin laminates, and polyimide films. These substrates usually carry a conductor pattern formed thereon beforehand by a known process.

As a particularly preferred example of the substrate on which the photolithographically viahole-forming photosensitive element is to be laminated, there is mentioned a substrate formed by the so-called additive technique. The additive technique comprises coating an insulating substrate with an adhesive, forming an electroless plating resist on the adhesive, and then applying electroless plating to form a pattern of a conductor such as copper. By choosing the plating resist and controlling the thickness of the precipitating metal, it is possible to obtain a substrate having such a high level of planarity that the plating resist and the conductor have substantially the same height. According to the additive technique, the plating resist can be used as a permanent resist without stripping off the same.

As another particularly preferred example of the substrate on which the photolithographically viahole-forming photosensitive element is to be laminated, there is mentioned a printed circuit board formed by the transfer technique. According to the transfer technique, a removable temporary substrate with a circuit formed by plating or the like is pressed on an insulating substrate to form a laminate, followed by the removal of the temporary substrate. The substrate prepared by the transfer technique has the conductor pattern embedded in the insulating material, so that an absolutely flat printed circuit board is obtained.

The lamination of the photolithographically viahole-forming photosensitive element onto such a flat substrate can be achieved readily. Use of a commonly-employed normal-pressure laminate assures good adhesion of the element to the substrate and the conductor pattern. It is possible to achieve lamination onto both sides of the substrate at once.

As the photolithographically viahole-forming photosensitive element to be laminated is planar, use of such a flat substrate can bring about, for example, such advantages that the accuracy of alignment of a mask upon photolithographic formation of viaholes can be improved, a uniform insulating layer can be formed and the design of circuitry can be simplified accordingly, and the insulating layer can be formed as a thin film.

After the photolithographic formation of viaholes, a multilayer circuit is formed usually by electroless plating. The planarity can also be utilized here. In general, electroless plating features uniform precipitation of a plating metal, thereby making it possible to plate while reflecting the concavities and convexities on the substrate. The metal plated on the flat substrate therefore has planarity. This permits formation of a more precise circuit and, as a technique for the formation of a circuit, use of a technique such as tenting in addition of the plating technique.

Use of a planar substrate can give particularly preferred results but, needless to say, a conventionally-employed, non-planar substrate can also be used. Since a conductive pattern is formed on the surface of the substrate, the substrate surface therefore contains steps corresponding to the existence of the conductor. In such a case, it is effective to flatten the steps by coating the photolithographically viahole-forming photosensitive resin composition in the form of a liquid formulation, drying the resin composition so coated, and then forming an insulating layer thereon. As an alternative, lamination of a photolithographically viahole-forming photosensitive element is also feasible. In this case, particular attention should be paid to the penetration of the photolithographically viahole-forming photosensitive element to the boundary between the insulating substrate and the conductor. To achieve this, it is necessary to conduct the lamination while paying particular attention to lamination conditions such as temperature, speed and pressure. As means for substantially relaxing these conditions to be watched carefully, use of a laminate equipped with vacuum means is desired.

The photosensitive adhesive film, which has been formed on the substrate by the photolithographically viahole-forming photosensitive element making use of the resin composition, is next subjected to an exposure step and a subsequent developing step, whereby interlayer connecting viaholes formed in the photosensitive adhesive film at desired locations. The exposure is usually conducted through a mask so that the photosensitive adhesive film is exposed to light at the desired locations. At this time, the photosensitive adhesive film formed using the photosensitive element is covered with the light-transmitting base material. This light-transmitting base material may be left as is, that is, covering the photosensitive adhesive film at the time of the exposure or, as an alternative, may be removed from the photosensitive adhesive film prior to the exposure. As an exposing equipment, an exposing equipment which has been used to date for the fabrication of printed circuit boards can be used as is.

If the photosensitive adhesive film so exposed is still accompanied by the light-transmitting base material, the light-transmitting base material is removed and unnecessary parts of the photosensitive adhesive film are removed by a developer to photolithographically form viaholes. It is to be noted that formation of a signal circuit pattern in addition to the viaholes formed photolithographically is embraced within the scope of the present invention. Upon developing, a developing technique such as spray developing or dip developing can be used.

Although a conventionally-employed developer such as 1,1,1-trichloroethane can be used as is as the developer, various chlorine-free solvents can also be used. Examples of such chlorine-free solvents include cellosolve solvents such as ethylcellosolve, butylcellosolve and cellosolve acetate; glycol solvents such as ethylene glycol and propylene glycol; cyclohexanone; and diacetone alcohol. They can be used either singly or in combination.

As a water-base developer (i.e., chlorine-free solvent), a mixed solution consisting of an alcohol-type organic solvent, a basic compound and water is preferred. A surfactant can also be added. Preferred examples of the alcohol-type organic solvent employed in the water-base developer include 2,2'-(butoxyethoxy)ethanol and 2-butoxyethanol. Such an alcohol-type organic solvent can be added desirably in an amount of from 10 g to 50 g per 100 g of water. The basic compound can be either organic or inorganic. Illustrative basic compounds include amines such as monoethanolamine and inorganic salts such as sodium tetraborate. Such a basic compound can be used desirably in an amount of from 0.5 g to 10 g per 100 g of water.

Subsequent to the develop, the photosensitive adhesive film with the viaholes formed photolithographically therein can be subjected treatments such as post-exposure and post-heating before passing it to the next step. There treatments can promote the hardening of the photosensitive adhesive film with the viaholes formed photolithographically therein, thereby bringing about preferred effects for the improvement of the heat resistance.

As a post-exposing equipment, it is possible to use an equipment such as a conveyor-type exposing equipment besides the exposing equipment employed for the formation of the image. Upon conducting the post-exposure, it is desired to intensify the irradiation than the level of irradiation upon formation of the image so that the photo-curing can be completed.

When post-heating is conducted to further promote the curing reaction, it is desired to heat the photo-sensitive adhesive film in such a temperature range that can promote the curing without thermal deterioration of the substrate. Usable examples of heating means include conventional hot-air oven, infrared oven and conveyor band oven. The heating temperature can range from 80° C. to 180° C., preferably from 100° C. to 160° C. A suitable heating time can be selected within a range of from 5 minutes to 5 hours.

As long as the objective to promote the curing is fulfilled, one or both of the post-exposure and the post-heating can be omitted of course, thereby contributing to the shortening of the fabrication process. No particular limitation is imposed on the order in which the post-exposure and the post-heating are performed.

In some instances, it is preferred to make the surface of the photosensitive adhesive film formed especially on a non-planar substrate by a suitable method such as grinding. This flattening leads to an improvement in the accuracy of the subsequent formation of a circuit in the surface layer. As grinding means, conventionally-used grinding means such as a buff roll, nylon brush or belt sander can be used.

Where throughholes are needed for the insertion of devices or for the interconnection with other conductive pattern layer, boring can be effected by drills. An ordinary NC drilling machine can be used here. Since signal interconnection between multiple conductive pattern layers are mostly effected by the viaholes formed photolithographically, the drilling is needed only at a necessary minimum, thereby significantly contributing to the shortening of the fabrication process.

After drilling is performed as needed, the surface of the photosensitive adhesive film is roughened by a roughening solution. It is the objective of the roughening to increase the surface area of the surface of the photosensitive adhesive film and hence to increase the adhesion strength of electroless plating. For this purpose, various roughening solutions are known. A desired one is chosen depending on the purpose. As examples of roughening solutions, there are known acidic roughening solutions containing chromic anhydride or sulfuric acid as a main component as well as alkaline roughening solutions containing a potassium permanganate or sodium hydroxide solution as a main component. Use of a chromic-acid-base roughening solution for the roughening treatment of the photosensitive adhesive film tends to give a better roughened surface and is hence desired.

The roughening solution can be conducted by dipping a substrate, in which viaholes have already been formed photolithographically, for an appropriate time in a roughening solution. It is the common practice to heat the solution upon dipping so that the roughening treatment can be accelerated. Where throughholes have been formed in the substrate, roughening of their side walls is also conducted at the same time by this roughening treatment.

The roughening treatment temperature and the dipping time vary because the activity of the roughening solution changes. It is generally appropriate to conduct the roughening treatment at a bath temperature ranging from room temperature to 80° C. for a period of from several minutes to several tens minutes. These conditions should be selected carefully, because the conductor, usually, copper exposed as a primer underneath the photosensitive adhesive film tends to be corroded by the roughening solution as the roughening proceeds.

As a solution for the problem of corrosion of the underlying conductor upon roughening, it is possible to form beforehand a barrier layer with a material having resistance to the roughening solution instead of controlling the roughening conditions as described above. As a barrier layer for copper, for example, a nickel layer can be mentioned.

In this case, it is only necessary to form a thin nickel layer beforehand on a conductor pattern arranged on an insulating substrate on which the photolithographically viahole-forming photosensitive element is to be stacked. For this purpose, it is mentioned to form nickel as a thin layer by a technique such as electroless nickel plating.

As another technique, it is also mentioned to form the substrate, which serves as a base, by the above-mentioned transfer technique. According to the transfer technique, a barrier layer of nickel or the like is formed in advance on a conductor which will serve as a carrier. With the nickel barrier interposed, a circuit pattern is formed by plating or the like. The circuit pattern is then transferred onto an insulating substrate and the carrier is removed to expose the circuit pattern. Accordingly, the nickel barrier layer formed beforehand still remains on the circuit pattern of the substrate fabricated by the transfer technique. Although this barrier layer is usually etched off, it can be retained until the end of the roughening step. This makes it possible to prevent corrosion of the underlying conductor by the roughening treatment without addition of any special step.

The thickness of the barrier layer can be set at a small value provided that etching and roughening solutions having large selectivity are used. Importantly, the barrier layer must be free of defects such as pinholes. The barrier thickness generally ranges from 0.05 µm to 10 µm, preferably from 0.1 µm to 5 µm although it varies depending on the technique employed upon formation of the barrier layer.

Roughening of the photosensitive adhesive film according to the present invention enables formation of a uniform fine pattern, thereby making it possible to obtain high peel strength. When a chromic acid/sulfuric acid type roughening solution was used, for example, peel strength as high as 2 kgf/cm to 3 kgf/cm was actually measured so that the usefulness of the present invention has been demonstrated.

Subsequent to the roughening treatment, it is necessary to have a plating catalyst carried on the surface. This plating catalyst will serve as precipitating nuclei upon conducting electroless plating. A variety of treatment solutions with a metal colloid of palladium or the like as a plating catalyst dispersed in various dispersing medium are known. The plating catalyst can be carried by dipping the substrate in the treatment solution after treating the substrate several times for its cleaning. Where the above-described barrier layer is formed on the surface of the conductor, it is desired to remove the barrier layer beforehand by etching or the like prior to having the catalyst carried. As long as no problem arises upon interconnection of conductive pattern layers, thin barrier removing step can be omitted.

When a plating catalyst has been mixed beforehand in the photosensitive resin composition, the above treatment for having the plating catalyst carried can be omitted.

After the catalyst has been carried, electroless plating is conducted. Here, treatment conditions for general electroless plating can be applied as are. A first technique for the formation of the second conductor comprises forming an electroless plating resist on a catalyst-carrying substrate and then performing electroless pattern plating. Techniques suited for this purpose include patterned formation of an electroless plating resist by a method such as screen printing, patterned formation of an electroless plating resist by applying a photosensitive liquid resist with coating means such as a curtain coater and then forming a pattern in a photolithographic manner, and patterned formation of an electroless plating resist by laminating a photosensitive electroless plating resist film and then forming a pattern. For the third technique, photosensitive solder masking films, "SR-3000" and "SR-3200" (trade names; products of Hitachi Chemical Co., Ltd.), are commercially available at various film thicknesses and can be used in the present invention.

A second technique for the formation of the second conductor comprises applying an electroless plating on the entire surfaces without using any electroless plating resist, applying an electroplating to a large thickness, forming a resist pattern with an etching resist, and then etching the platings to form a conductor pattern. This technique has the advantage that the potential problem of penetration of a plating solution can be lessened because the time required for plating can be shortened and the electroless plating time is short.

Since the second conductive pattern is formed by a technique such as the first or second technique, it is possible to transfer a concave-convex pattern of from 0.01 to 10 µm in depth can be transferred onto the surface of the photolithographically viahole-forming photosensitive element, which will serve as an insulating layer, before electroless plating is conducted.

Namely, the photolithographically viahole-forming photosensitive element is exposed and developed to form viaholes for interlayer connection and, if necessary, is then subjected to further treatment such as exposure and heating, whereby the curing degree of the insulating layer is increased as needed. The insulating layer is then brought into close contact with a substrate having a concave-convex pattern of from 0.01 µm to 10 µm or so. They are press-bonded so that the concave-convex pattern is transferred. The press bonding can be conducted under a desired pressure ranging from 1 kgf/cm$_2$ to 1,000 kgf/cm$^2$. Although they can be heated at a temperature in a range of from 40° C. to 400° C. concurrently with the press bonding. It is preferred to choose heating conditions in view of the properties of the insulating layer so that the pattern of the image formed by the above exposure and development is not broken or otherwise deformed.

From the insulating layer subjected to the press-bonding, the substrate employed for the transfer of the concave-convex pattern is then removed. The substrate can be physically peeled off it the substrate has flexibility- To avoid damage to the concave-convex pattern transferred to the insulating layer, however, it is preferred to use a chemical technique such as dissolution. When a copper foil is used as a substrate, an aqueous solution of ammonium persulfate or a copper etchant of the ammonia complex type can be used for this purpose.

A plating catalyst is then applied to the insulating layer to which the concave-convex pattern has been transferred (this step is omitted where a plating catalyst has already been incorporated in the insulating layer). By electrolysis plating, a conductor layer such as a copper or nickel layer can then be formed. The conductor layer is required to have a thickness of from several µm to 100 µm or so. This thickness can be achieved only by electroless plating or by using electroplating in combination.

The conductor layer so obtained is then converted into a circuit pattern by a conventional photolithographic technique, so that a second conductor pattern is formed. Multi-layer metallization can be achieved in this manner.

No particular limitation is imposed on a substrate which has a concave-convex pattern and is employed for transferring the concave-convex pattern to an insulating layer. Although a plastic or metal foil or sheet can be used, it is preferred to use a metal foil such as an aluminum foil, nickel foil or copper foil because such metal foil facilitates the subsequent removal of the substrate.

Although various copper foils can be used, use of an electrolytic copper foil which carries a fine concave-convex pattern formed by roughening its surface or optionally subjecting the thus-roughened surface to oxidation-reduction treatment is preferred.

After the press-bonding, the substrate carrying the fine concave-convex pattern on its surface must be removed from the surface of the insulating layer. When a copper foil is used, the substrate can be removed by etching. As an etchant, an aqueous solution of ammonium persulfate, an etchant of the multivalent ammonia complex type, or the like can be used.

It is also possible to use, as a transferring surface of a fine concave-convex pattern, a nickel surface of a double-layer copper foil having a nickel layer of about 1 to 2 µm in thickness clad on a copper foil. Subsequent to etching the copper foil, only the nickel layer can be etched by a selective etchant for nickel.

A plating catalyst is then applied to the surface which carries the fine concave-convex pattern transferred (hereinafter called a "transferred and roughened surface"). This makes it possible to precipitate electroless plating copper, electroless plating nickel or the like, so that a conductor layer can be formed. This conductor layer can be formed only by electroless plating (first technique). As an alternative, it can also be formed by further applying electroplating onto the conductor layer formed by electroless plating (second technique).

As a third technique for forming a second conductor pattern, there is a technique which makes use of a metal foil such as a copper foil. Namely, a photolithographically viahole-forming photosensitive element is laminated as an insulating layer on a circuit board on which a first conductor pattern has been formed. The photosensitive element is then subjected to pattern exposure. Development is then carried out to form viaholes for interlayer connection, that is, holes reaching the first conductor pattern. Subsequent to the formation of the viaholes, the curing degree of the insulating can be increased as needed by treatment such as exposure and heating.

The insulating layer is then brought into a contiguous relationship with a metal foil having a concave-convex pattern of from about 0.01 µm to 10 µm or so, followed by press-bonding. This press-bonding can be conducted under a desired pressure ranging from 1 kgf/cm$^2$ to 1,000 kgf/cm$^2$. It is possible to perform heating within a temperature range of from 40° C. to 400° C. at the same time as the press-bonding, but it is preferred to select heating conditions in view of the properties of the insulating material used so that the configurations of the viaholes so formed are not damaged.

Next, an etching resist is formed on the metal foil at parts other than those corresponding to the interlayer connecting viaholes formed in the photolithographically viahole-forming photosensitive element as the insulating layer. In other words, the etching resist is formed except for the parts where the copper foil is etched to form land holes. Preferably, the land holes have a diameter greater than that of the interlayer connecting viaholes of the insulating layer in view of possible mis-alignment.

The metal foil is then etched at the parts where the etching resist is not formed, so that the land holes are formed. The etching of the metal foil can be effected using an aqueous solution of ammonium persulfate or a copper etchant of the ammonium complex type.

By plating treatment, the first conductor pattern and the metal foil are electrically connected through the interlayer connecting viaholes formed through the insulating layer. The plating treatment can be conducted after stripping off the etching resist in advance. As an alternative, it is possible to conduct the plating treatment first without stripping off the etching resist, followed by the stripping-off of the etching resist.

To conduct the plating without stripping off the etching resist, electroless plating is applied after the metal foil is etched off at the parts corresponding to the interlayer connecting viaholes. Electroplating can also be used in combination if necessary. As a result, the first conductor pattern and the metal foil are connected together. The etching resist is then stripped off to advance to the next step.

When plating is applied after the etching resist is stripped off in advance, the metal foil is etched off at the parts corresponding to the interlayer connecting viaholes, followed by electroless plating. Here, electroplating can also be used in combination if necessary, whereby the first conductor pattern and the metal foil are connected.

As the plating is performed as full-surface plating, the plating is also effected onto the metal foil as the plating to the interlayer connection viaholes proceeds. This may therefore increase the thickness of a circuit to be formed subsequently. It is therefore preferred to use a thinner metal foil as the metal foil to be press-bonded. In view of the mechanical strength and the like, a copper/nickel/copper triple-layer foil can be used.

When such a triple-layer foil is used, selective etching of copper and that of nickel can be conducted subsequent to the press-bonding, so that a thin copper foil layer can then be formed.

As a copper etchant, it is possible to use an aqueous solution of ammonium persulfate, an etchant of the multivalent ammonia complex type, or the like can be used.

As a nickel-selective etchant, "Melstrip Solution" (trade name; nickel-selective etchant produced by Japan Meltex Inc.) or the like can be used.

After connected with the first conductor pattern by the plating treatment, a second conductor pattern to be connected to the first conductor pattern is formed by conventional photolithography or the like so that multilayer metallization can be effected.

As one example of a process for the fabrication of the photolithographically viahole-forming photosensitive element, the first photosensitive resin composition is coated on the light-transmitting base material, followed by the coating of the second photosensitive resin composition over first photosensitive resin composition so coated. With a view to improving the workability, these photosensitive resin compositions are usually diluted with a solvent upon their formulation or application so that they can be used in the form of liquid formulations having an adequate viscosity. As an alternative, they can also be coated in the form of hot melts. Here an appropriate solvent can be selected from those having a suitable degree of solubility to the above compositions. Different solvents can be used for the first photosensitive resin composition and the second photosensitive resin composition.

Examples of usable solvents include methyl ethyl ketone, acetone, toluene, xylene, ethyl acetate, propyl acetate, ethylcellosolve, methylcellosolve, and cellosolve acetate.

The photolithographically viahole-forming photosensitive element can be fabricated by a coating machine equipped with feeding means for the light-transmitting base material, coating means, drying means, laminating means for the protective film, take-up means, etc. Described more specifically, the photolithographically viahole-forming photosensitive element can be obtained by uniformly coating each photosensitive resin composition in the form of a liquid formulation through a gap defined by a doctor roll, a knife, a nozzle or the like, drying the liquid formulation to eliminate the solvent and, if necessary, taking up the protective film or the like after the lamination.

Various techniques can be applied upon fabrication of the photolithographically viahole-forming photosensitive element. For example, by the above coating machine, the first photosensitive adhesive film is formed as the first layer on the light-transmitting base material, followed by the overcoating of the second photosensitive adhesive film as the second layer on the first layer. The respective steps can be conducted either batchwise or continuously by a multi-stage coating machine. As a further alternative, the photolithographically viahole-forming photosensitive element can also be fabricated by bonding the second photosensitive adhesive film coated beforehand as the second layer on a separate substrate whose surface had been treated with a parting agent.

As a second technique, the respective coating formulations are caused to jet out or flow down in the form of multilayer liquid films through many nozzles while the state of laminar flows is ensured. The light-transmitting base material is then coated at once with the liquid films. According to this technique, the steps required for the coating work can be made fewer, thereby making it possible to provide photolithographically viahole-forming photosensitive elements at low cost.

Each photolithographically viahole-forming photosensitive element described above have different kinds of materials laminated together so that separation or the like may take place between the materials upon development. As one cause for this problem, the above problem may probably be attributed to a difference in curing degree between the respective layers upon their photocuring. By controlling the curing sensitivity of the respective layers to an equal level, it is possible to minimize separation at the interface of the laminated layers, to improve the image formability and further to avoid film roughening upon drying.

As a method for adjusting the curing sensitivity of the first layer formed of the first photosensitive resin composition, it is most convenient to rely upon the amount of the aromatic polyazide compound in the first photosensitive resin composition. As an alternative, it is also possible to adjust the curing sensitivity by changing the amounts of the rubber, phenol resin, the epoxy resin, the epoxy resin curing agent, the filler and/or the like.

As a method for adjusting the curing sensitivity of the second layer, it is convenient to rely upon the amount of the photopolymerization initiator in the second photosensitive resin composition. As an alternative, it is also possible to adjust the curing sensitivity by changing the amounts of the film-forming polymer and/or the ethylenically-unsaturated monomer.

It is also possible to adjust the curing sensitivities of the first and second layers by changing their thicknesses.

Evaluation of the sensitivity of each photosensitive resin composition to exposure is performed, for example, as will be described next. A layer of the photosensitive resin composition is exposed through a gradient sensitivity mask (whose transmittance varies in 21 stages ranging from 100% to 1%) stacked thereon. subsequent to the exposure, the layer is developed. The part of the layer, said part being located between those dissolved by a developer and those undissolved by the developer, is then compared with the gradient sensitivity mask to determine the transmittance of the corresponding part of the gradient sensitivity mask. Two types of photosensitive resins are determined to have the same sensitivity to exposure provided that, when they are developed subsequent to exposure, parts of their layers, each located between dissolved parts and undissolved parts, are found to have been exposed to radiation transmitted through parts of gradient sensitivity masks, said mask parts having the same level of transmittance (for example, the eighth level).

In the technique in which the first layer of the first photosensitive resin composition and the second layer of the second photosensitive resin composition are laminated together, separation may take place at the interface between both the layers upon development. It is therefore desired to enhance their adhesion.

Their adhesion at the interface can be enhanced and improved by including at least one common component in the first and second photosensitive resin compositions.

In the case of the first photolithographically viahole-forming photosensitive element, for example, the second photosensitive resin composition for the second layer contains as an essential component a photopolymerizable composition comprising:

(a) 100 parts by weight of a mixture comprising:

(a-1) 20 to 80 parts by weight of a film-forming polymer, and (a-2) 20–80 parts by weight of an ethylenically-unsaturated monomer; and (b) 1 to 10 parts by weight of a photopolymerization initiator.

and at least one of the following components:

(c) 1 to 10 parts by weight of a rubber;
(d) 1 to 5 parts by weight of a phenol resin, and
(e) 1 to 10 parts by weight of an epoxy resin.

The first photosensitive resin composition for the first layer, on the other hand, comprises:
(a) 100 parts by weight of a mixture comprising:
  (a-1) 10 to 90 parts by weight of a rubber,
  (a-2) 5 to 40 parts by weight of a phenol resin, and
  (a-3) 10 to 80 parts by weight of an epoxy resin;
(b) 0.1 to 10 parts by weight of an epoxy resin photoinitiator; and
(c) 0.1 to 10 parts by weight of an aromatic polyazide compound;
and, optionally,
(d) 5 to 40 parts by weight of a filler; and
(e) at least one of the following ingredients:
  (e-1) 1 to 20 parts by weight of a film-forming polymer, and
  (e-2) 1 to 20 parts by weight of an ethylenically-unsaturated monomer.

By forming the first photosensitive resin composition of the above-described formulation as the first layer after the formation of the second photosensitive resin composition of the above formulation as the second layer on a circuit board, a laminate with improved adhesion between the first layer and the second layer can be obtained.

Instead of successively laminating the first and second layers on a circuit board as described above, it is also possible to laminate them on a suitable film and then to laminate them together onto a circuit board.

According to the above-described process for the fabrication of the multilayer wiring board of the first aspect of this invention, a circuit board on which a first conductor pattern has been formed is laminated with a film of an insulating, photosensitive resin composition which permits formation of an image by radiation, formation of a fine pattern on the surface thereof by a roughening solution, and also precipitation of a conductor. The film of the insulating, photosensitive resin composition is then exposed and developed to form viaholes reaching the first conductor pattern. A second conductor pattern is then formed on the film of the insulating, photosensitive resin composition in such a way that the second conductor pattern can be conducted to the first conductor pattern. Use of the photosensitive resin compositions in the form of films makes it possible to photolithographically fabricate multilayer wiring boards with extremely good productivity.

According to the process for the fabrication of the multilayer wiring board of the second aspect of the present invention, a second insulating, photosensitive resin composition is optionally formed as a second layer on a circuit board on which a first conductor pattern has been formed. Formed further as a first layer on the second layer is a first photosensitive resin composition which permits formation of an image by radiation, formation of a fine pattern on the surface thereof by a roughening solution, and also precipitation of a conductor. The first and second layers are then exposed and developed to form viaholes reaching the first conductor pattern. A second conductor pattern is then formed on the first layer in such a way that the second conductor pattern can be conducted to the first conductor pattern. The multilayer wiring board can therefore be fabricated with high reliability, high density and high accuracy. It is preferred to use the first and second photosensitive resin compositions by laminating them in the form of films.

EXAMPLE 1

A mixture A was obtained by kneading 60 parts by weight of acrylonitrile-butadiene rubber ("Nipole 1042", trade name; product of Nippon Zeon Co., Ltd.), 20 parts by weight of a phenol resin ("Hitanol 2400", trade name; product of Hitachi Chemical Co., Ltd.), 20 parts by weight of an epoxy resin ("UVR6510", trade name; product of Union Carbide Corp.), 1 part by weight of an epoxy resin curing agent ("UVI-6970", trade name' product of Union Carbide Corp.), 10 parts by weight of MgO (product of Wako Pure Chemical Industries, Ltd.), 5 parts by weight of $Ca(OH)_2$ (product of Wako Pure Chemical Industries, Ltd.), 2 parts by weight of $SiO_2$ ("NIP-SIL" trade mark; product of Nippon Silica Industrial Co., Ltd.), 10 parts by weight of $ZrSiO_4$ ("MICRO-PAX SS", trade name; product of HAKUSUI CHEMICAL INDUSTRY CO., LTD.), 0.5 part by weight of 3,3'-dimethoxy- 4,4'-diazidobiphenyl ("AZ025", trade name; product of RESPECT CHEMICAL CO., LTD.) and 300 parts by weight of methyl ethyl ketone.

A mixture B was obtained by mixing and dissolving 50 parts by weight of a 97/3 copolymer of methyl methacrylate and ethyl acrylate (weight average molecular weight: about 90,000 as converted on the basis of polystyrene), 50 parts by weight of a 1/2/2 adduct of trimethylhexane diisocyanate, tolylene diisocyanate and hydroxyethyl acrylate, 6 parts by weight of "Irgacure 651", 0.05 part by weight of "ANTAGE W-500" (product of Kawaguchi Chemical Industry Co., Ltd.), 0.1 part by weight of a leveling agent ("SH193") and 0.04 part by weight of victoria pure blue (product of Hodogaya Chemical Co., Ltd.) in about 140 parts by weight of methyl ethyl ketone.

The mixture A prepared in advance was coated by an applicator (manufactured by YOSMIMITSU-SEIKI CO., LTD.) onto one side of a 38-μm thick polyethylene terephthalate film ("SG38", trade name; product of Teijin Limited), said one side having been treated with a polyolefin-base parting agent. The film so coated was dried at 80° C. for 10 minutes in a drier ("SPH-200" trade name; manufactured by Tabai Estec K. K.), whereby a first layer of a first photosensitive resin composition was formed to a thickness of 20 μm.

The mixture B was next coated likewise on the first layer, followed by drying at 80° C. for 15 minutes so that a second layer of a second photosensitive resin composition was formed. The total thickness of the first and second layers was 50 μm.

The thus-obtained photolithographically viahole-forming photosensitive element was laminated at 130° C. onto a substrate by a laminator manufactured by E. I. Du Pont de Nemours & Co., Inc. Employed as the substrate was that obtained by applying electrolytic nickel plating to 2 μm on a cleaned copper foil surface of a copper-clad laminate ("MCL-E-67-1.6t", product of Hitachi Chemical Co., Ltd.).

The thus-laminated substrate was subjected to imagewise exposure via a photomask through which holes of various diameters were formed. Using a double-side exposure equipment (Model: HMW201) as an exposure equipment, the above-laminated substrate was exposed at 150 $mJ/cm^2$ on a vacuum baking frame under reduced pressure.

The polyethylene terephthalate film was peeled off. The thus-exposed substrate was then dipped for 50 seconds in 1,1,1-trichloroethane whose temperature was controlled at 15° C., whereby the substrate was developed to form viaholes having a minimum diameter of 150 μm.

After the development, the substrate was first exposed at 3 $J/cm^2$ using an electrodeless UV-irradiation system (manufactured by SOMAR Corporation; equipped with fusion lamps "ABLIB/M", trade name). The substrate was then heated at 135° C. for 30 minutes in a dryer ("SPH-200", trade name; manufactured by Tabai Estec K. K.), so that curing of the photolithographically-formed adhesive was promoted.

After completion of the post-curing, the substrate was dipped at 50° C. for 5 minutes in a roughening solution which had been prepared by dissolving 60 g of chromic-anhydride and 230 ml of concentrated sulfuric acid. The surface was hence subjected to the roughening treatment. The substrate was then subjected to hydrochloric acid (35%) treatment and caustic soda treatment (4 g/l), whereby the filler was partially dissolved out to complete the roughening treatment. As a result of observation by a scanning electron microscope, formation of a fine pattern on the surface was confirmed.

The substrate was then dipped for 10 seconds in a nickel etchant ("Melstrip N-950", trade name; product of Japan Meltex Inc.), so that nickel exposed at the bottom of each viahole was dissolved. Exposure of copper at the bottom of each viahole was visually confirmed.

Using an electroless copper plating catalyst of the sodium chloride type, fine palladium particles which would serve as precipitating nuclei were carried on the surface in accordance with prescribed procedures. Electroless plating was then carried out at 50° C. for 20 minutes in "HITACHI High-Speed Electroless Plating Bath Composition L-59" (trade name; product of Hitachi Chemical Co., Ltd.) by prescribed procedures. The substrate was then subjected to full-surface plating at room temperature for 30 minutes at a current density of 5 A/dm$^2$ in a copper-sulfate-base bright electrolytic plating bath. It was confirmed that bright copper plating was allowed to uniformly precipitate to a thickness of about 35 μm on the entire surface. Plating on the wall of each viahole was also good. Penetration of the plating solution was not observed.

Using a photomask having a circuit pattern, a circuit was formed in the upper layer. Namely, using "Etching Dry Film Photec H-S940" (trade name; manufactured by Hitachi Chemical Co., Ltd.), lamination (130° C.), exposure (45 mJ/cm$^2$) and development (1% aqueous solution of sodium carbonate; 45 seconds) were conducted, whereby in a manner similar to the tinting technique, a resist pattern in which parts corresponding to viaholes and circuitry were protected was formed and copper chloride etching was conducted to form a circuit. A good circuit pattern was formed and no problem arose upon connection through the viaholes.

EXAMPLE 2

Using the mixtures A and B prepared above, a photolithographically viahole-forming photosensitive element in which the total thickness of a first layer (25 μm) of a first photosensitive resin composition and a second layer of a second photosensitive resin composition was 58 μm was obtained similarly.

EXAMPLE 3

Using the mixtures A and B, a photolithographically viahole-forming photosensitive element in the form of a rolled film was prepared by a prototype coating machine equipped with a doctor roll. Onto the above-described 38-μm polyethylene terephthalate film which had been treated with the parting agent, the mixture A was coated to give a dry coat thickness of 16 μm. The film so coated was then taken up. The resulting roll was then transferred to a feeding side. The mixture B was then coated onto the coating of the mixture A so that the total thickness of both the photosensitive layers would become 46 μm after the coating and drying. The thus-coated film was then dried and, while laminating a polyethylene film of 30 μm in thickness, was taken up, so that a roll-shaped photolithographically viahole-forming photosensitive element having a coat width of 330 mm was obtained. Measurement of Peel Strength of Plated Copper:

The photolithographically viahole-forming photosensitive elements prepared in Example 1 to Example 3 were used. Each of the elements was laminated in a similar manner to Example 1 onto a roughed epoxy resin surface of a glass-epoxy resin laminate from which a copper foil had been removed. The element was subjected to full-face exposure and, after being dipped for 60 seconds in 1,1,1-trichloroethane, post-exposure, post-heating, roughening, electrolees copper plating and electrolytic copper plating were conducted likewise, whereby a sample was prepared for the measurement of the peel strength of the copper plated on the entire surface. The copper plating was slit at widths of 1 cm. Using a "Tensilon RTM-100" (trade name; manufactured by ORIENTEC K. K.), the peel strength was measured at room temperature from an end face.

Measurement of Withstand Voltage:

The photolithographically viahole-forming photosensitive element prepared in Examples 1 to 3 were each laminated on a copper foil whose thickness was 35 μm. In a similar manner to the measurement of the peel strength, full-face exposure, developer dipping, post-exposure, post-heating and roughening were conducted. Electrodes were formed with a silver paste on the surface and the withstand voltage was measured. The measurement was conducted by applying a d.c. voltage for 5 minutes while increasing the voltage 50 V by 50 V, A voltage applied immediately before detection of a leak current of 1 mA was recorded as a withstand voltage.

The results of the above measurements are summarized in Table 1.

TABLE 1

|  |  | Ex. 1 | Ex. 2 | Ex. 2 |
| --- | --- | --- | --- | --- |
| Thickness of the first photosensitive layer | (μm) | 20 | 25 | 16 |
| Thickness of the second photosensitive layer | (μm) | 30 | 30 | 30 |
| Total layer thickness | (μm) | 50 | 55 | 46 |
| Smallest viahole diameter | (μm) | 120 | 120 | 120 |
| Roughening readiness |  | good | good | good |
| Peel strength (kg/cm) |  | 1.6 | 1.8 | 1.2 |
| Dielectric breakdown voltage | (V) | 4.8 | 6.5 | 3.6 |

Synthesis Example 1

"Ep1004" (trade name; Yuka shell Epoxy Kabushiki Kaisha) was dissolved in cyclohexanone to give a resin content of about 30%. The number of hydroxyl groups in the resin component was roughly calculated. Maleic anhydride in a mole number equivalent to 25% of the number of the hydroxyl groups was added, followed by heating at 140° C. for 8 hours under reflux. The N.V. content and acid value of the maleic-acid-modified epoxy resin so obtained were 35% and 40, respectively.

Synthesis Example 2

"Ep1007" (trade name; Yuka Shell Epoxy Kabushiki Kaisha) was dissolved in cyclohexanone to give a resin content of about 30%. Tetrahydrophthalic anhydride in a mole number equivalent to 15% of the number of hydroxyl groups in the resin component was added, followed by heating at 140° C. for 8 hours under reflux. The N.V. content and acid value of the tetrahydrophthalic-acid-modified epoxy resin so obtained were 36% and 24, respectively.

Synthesis Example 3

"M-3000-80" (trade name for maleic rubber having an acid value of 80; product of Nippon Oil Company Ltd.) was dissolved in cyclohexanone to give a resin content of about 65%. From the acid value of the maleic rubber, the amount of 2-hydroxyethyl acrylate needed to modify the rubber with acrylic acid was calculated. To the rubber solution, 2-hydroxyethyl acrylate was then added in the amount so calculated, followed by heating at 100° C. for 8 hours under reflux. The N.V. content of the carboxylic-acid-modified rubber so obtained was 70%.

Synthesis Example 4

"M-3000-50" (trade name for maleic rubber having an acid value of 50; product of Nippon Oil Company Ltd.) was dissolved in cyclohexanone to give a resin content of about 65%. From the acid value of the maleic rubber, the amount of 2-hydroxyethyl acrylate needed to modify the rubber with acrylic acid was calculated. To the rubber solution, 2-hydroxyethyl acrylate was then added in the amount so calculated, followed by heating at 100° C. for 8 hours under reflux. The N.V. content of the carboxylic-acid-modified rubber so obtained was 70%.

Synthesis Example 5

A reaction solvent consisting of methylcellosolve and toluene was charged in a reaction flask. By feeding nitrogen gas into the flask, the flask was purged with nitrogen gas. At 85° C., a solution of monomers (methyl methacrylate:butyl acrylate:methacrylic acid:2hydroxyethyl methacrylate =75:15:2:4), an initiator and a solvent was added at an appropriate dropping velocity. After the completion of the dropwise addition, the monomers were reacted for 4 hours, and the catalyst in an amount half of that added above was dissolved in a small amount of the solvent and was then added. After the contents of the flask were reacted for 2 hours, a polymerization inhibitor was added. Maleic anhydride was then added in an amount of 3 wt. %, followed by reaction at 80° C. for 8 hours. The N.V. content of the maleic-acid-modified acrylic resin so obtained was 45%.

A mixture A was obtained by kneading 40 parts by weight of the maleic-acid-modified epoxy resin synthesized in Synthesis Example 1, 40 parts by weight of the acrylic resin synthesized in Synthesis Example 5, 20 parts by weight of the carboxylic-acid-modified rubber synthesized in Synthesis Example 3, 4 parts by weight of 3,3'-dimethoxy-4,4'-diazidobiphenyl as a bisazide, 20 parts by weight of "BBMI" (trade name; product of Hitachi Chemical Co., Ltd.) as a bis-maleimide, 2 parts by weight of "Perhexin 25B" (trade name; product of Nippon Oil & Fats Co., Ltd.) as a polymerization initiator, 6 parts by weight of calcium hydroxide, 12 parts by weight of zirconium silicate and 4 parts by weight of silica, all as fillers, and 300 parts by weight of cyclohexane.

A mixture B was obtained by kneading 50 parts by weight of a 85.5/4.5/10 copolymer of methyl methacrylate, methacrylic acid and butyl methacrylate, 50 parts by weight of "BPE-10" (trade name; product of Shin-Nakamura Chemical Co., Ltd.), 6 parts by weight of "I-651" (trade name; product of Ciba-Geigy AG), 0.04 part by weight of victoria pure blue and 140 parts by weight of methyl ethyl ketone.

Using the mixtures A and B, a photolithographically viahole-forming photosensitive element was fabricate in the form of a roll film by a prototype coating machine equipped with a doctor roll. Namely, the mixture A was coated onto a 20-μm PET film "GS" (trade name; product of Teijin Limited) to give a dry thickness of 28 μm. The film so coated was then taken up. The roll so taken up was then transferred to the feeding side, and the mixture B was coated onto the mixture A so that the total thickness of both the photosensitive layers would become 58 μm after coating and drying. The thus-coated film was then dried and, while laminating a polyethylene film of 30 μm in thickness, was taken up, so that a roll-shaped photolithographically viahole-forming photosensitive element having a coat width of 330 mm was obtained.

The photolithographically viahole-forming photosensitive element so obtained was laminated at 120° C. onto a substrate by using a laminator manufactured by E. I. du Pont de Nemours & Co., Inc. Employed as the substrate was a printed circuit board on which a viahole-conduction-checking test pattern had been formed by the above transfer technique.

The thus-laminated substrate was exposed imagewise through a photomask having viaholes of 500 μm, 300 μm, 150 μm and 100 μm in diameter. As an exposure equipment, the exposure equipment (model: HMW201) was used. On a vacuum baking frame, the substrate was exposed at 1,000 mJ/cm$^2$ under reduced pressure.

The PET film was peeled off, and the substrate was developed for 180 seconds by a spray developing machine whose temperature was controlled at 25° C. The developer had the following composition: 2,2'-(butoxyethoxy)ethanol/sodium tetraborate/water=20/0.8/80. After rinsed with water, the substrate was dried at 60° C. for 30 minutes and then subjected to post-exposure at 3 J/cm$^2$ by the electrodeless UV-irradiation system (manufactured by SOMAR Corporation; equipped with fusion lamps "ABLIB/M", trade name). The substrate was then post-heated at 160° C. for 30 minutes in a drier ("SPH-200", trade name; manufactured by Tabai Estec K. K.).

After completion of the post-curing, the surface was uniformly ground using "FUJI WHITE" (trade name; alumina #220 produced by Fuji Seiki Seizosho K. K. on a sand blast ("HD-10", trade name; manufactured by Fuji Seiki K. K.). Then, using a roughening solution of the permanganic acid/sodium hydroxide type, the surface was roughened by a prescribed method, followed by treatment with a neutralizing solution of the hydrazine sulfate type. The substrate was then subjected to hydrochloric acid (35%) treatment and caustic soda treatment (4 g/l), whereby the filler was partially dissolved out to complete the roughening treatment.

The substrate was then dipped for 60 seconds in the nickel etchant ("Melstrip N-950", trade name; product of Japan Meltex Inc.), so that nickel was stripped off.

Using an electroless copper plating catalyst of the sodium chloride type, fine palladium particles which would serve as precipitating nuclei were carried on the surface in accordance with prescribed procedures. Electroless plating was then carried out at 60° C. for 20 minutes in "HITACHI High-Speed Electroless plating Bath Composition L-59" (trade name; product of Hitachi Chemical Co., Ltd.) by prescribed procedures. The substrate was then subjected to full-surface plating at room temperature for 1 hour at a current density of 2 A/dm$^2$ in a sulfate-base bright electrolytic plating bath. It was confirmed that bright copper plating was allowed to uniformly precipitate to a thickness of about 35 μm on the entire surface.

A circuit was formed in the upper layer by using a photomask defining a test circuit pattern therein. A resist ("HN340-40", trade name; product of Hitachi Chemical Co., Ltd.) was laminated and exposed and developed to form a resist pattern. The copper was etched so that a circuit was formed. The resist was finally stripped off with a 4% aqueous solution of sodium hydroxide maintained at 40° C., so that a substrate with viaholes formed photolithographically and a circuit conforming with the test pattern was obtained. The conductivities of the viaholes were measured. The measurement results are shown in Table 2.

TABLE 2

| Viahole diameter (μm) | 500 | 300 | 150 | 100 |
|---|---|---|---|---|
| Conductivity (%) | 100 | 100 | 100 | 54 |

EXAMPLE 5

The mixtures A and B of Example 4 were used. In a manner similar to Example 1, the mixture A was coated to give dry coat thickness of 20 μm, and the mixture B was coated so that the thickness of both the photosensitive layers would become 50 μm after coating and drying. A photolithographically viahole-forming photosensitive element was hence fabricated in the form of a roll.

The photolithographically viahole-forming photosensitive element so obtained was laminated onto a copper-clad laminate ("MCL-E-67-1.6t", trade name; product of Hitachi Chemical Co., Ltd.) as in Example 1. Through a photomask having holes of various diameters ranging from 1,000 μm to 50 μm and defining an imageforming test pattern, the laminate was exposed imagewise at 700–1000 mJ/cm² in a similar manner to Example 1. The polyethylene terephthalate film was peeled off, and the laminate was developed for 1 to 7 minutes by a spray developing apparatus whose temperature was controlled at 25° C. or 30° C. After rinsed with water, samples so prepared were observed. It has been found that viaholes having a diameter of 100 μm can be formed 100% by spray-developing a sample, which has been exposed at 700 mJ/cm², for 5 minutes while controlling the temperature of the developer at 25° C.

EXAMPLE 6

The photolithographically viahole-forming photosensitive elements obtained in Example 4 were laminated onto a substrate, which had been prepared by etching the copper of "MCL-E-67-1.6t" to have the epoxy resin surface exposed, and also onto a copper foil. The adhesion strength and withstand voltage of plated copper were studied. A sample obtained by laminating the element on an epoxy resin substrate was subjected to roughening, electroless plating and electroplating in a similar manner to Example 1, so that a sample was obtained for the measurement of the peel strength. As a result, the copper peel strength and withstand voltage were found to be $0.6 \times 10^3$ N/m and 6.5 kV, respectively.

EXAMPLE 7

A first photosensitive resin composition A05 was obtained by mixing and dissolving 50 parts by weight of acrylonitrile-butadiene rubber ("Nipole 1042", trade name; product of Nippon Zeon Co., Ltd.), 30 parts by weight of a phenol resin ("Hitanol 2400", trade name; product of Hitachi Chemical Co., Ltd.), 30 parts by weight of an epoxy resin ("UVR6510", trade name; product of Union Carbide Corp.), 1 part by weight of an epoxy resin curing agent ("UVI-6970", trade name' product of Union Carbide Corp.), 10 pats by weight of MgO (product of Wako Pure Chemical Industries, Ltd.), 5 parts by weight of Ca(OH)$_2$ (product of Wako Pure Chemical Industries, Ltd.), 2 parts by weight of SiO$_2$ ("NIP-SIL" trade mark; product of Nippon Silica Industrial co., Ltd.), 10 parts by weight of ZrSiO$_4$ ("MICRO-PAX SS", trade name; product of HAKUSHI CHEMICAL INDUSTRY CO., LTD.) and 0.5 part by weight of 3,3'-dimethoxy-4,4'-diazidobiphenyl ("AZ025", trade name; product of RESPECT CHEMICAL CO., LTD.) in 300 parts by weight of methyl ethyl ketone. First photosensitive resin compositions positions A10, A15 and A25 were also obtained in a similar manner except that the amount of 3,3'-dimethoxy-4,4'-diazidobiphenyl was changed to 1.0 part by weight, 1.5 parts by weight and 2.5 parts by weight, respectively.

A second photosensitive resin composition B4 was obtained by mixing and dissolving 55 parts by weight of a 97/3 copolymer of methyl methacrylate and ethyl acrylate (weight average molecular weight: about 90,000 as converted on the basis of polystyrene), 45 parts by weight of a 1/2/2 addact of trimethylhexane diisocyanate, tolylene diisocyanate and hydroxyethyl acrylate, 0.05 part by weight of "ANTAGE W-500" (product of Kawaguchi Chemical Industry Co., Ltd.), 0.1 part by weight of a leveling agent ("SH193"), 0.04 part by weight of victoria pure blue (product of Hodogaya Chemical Co., Ltd.) and 4 parts by weight of "Irgacure 651" (hereinafter abbreviated as "Irg") in about 140 parts by weight of methyl ethyl ketone. Another second photosensitive resin composition B6 was also obtained in a similar manner except that the amount of Irg was increased to 6 parts by weight.

A further second photosensitive resin composition C01 was obtained by mixing and dissolving 55 parts by weight of a 97/3 copolymer of methyl methacrylate and ethyl acrylate (weight average molecular weight: about 90,000 are converted on the basis of polystyrene), 45 parts by weight of a 1/2/2 adduct of trimethylhexane diisocyanate, tolylene diisocyanate and hydroxyethyl acrylate, 4 parts by weight of benzophenone (product of Wako Pure Chemical Industries, Ltd.), 0.05 part by weight of "ANTAGE W-500" (product of Kawaguchi Chemical Industry Co., Ltd.), 0.1 part by weight of a leveling agent ("SH193"), 0.04 part by weight of victoria pure blue (product of Hodogaya Chemical Co., Ltd.) and 0.1 part by weight of 4,4'-diethylaminobenzophenone (hereinafter abbreviated as "EAB") in about 140 parts by weight of methyl ethyl ketone. A still further second photosensitive resin composition C02 was also obtained in a similar manner except that the amount of EAB was increased to 0.2 part by weight.

The first the photosensitive adhesive film A05 was coated by an applicator (manufactured by YOSHIMITSU-SEIKI CO., LTD.) onto one side of a 38-μm thick polyethylene terephthalate film ("SG38", trade name; product of Teijin Limited), said one side having been treated with a polyolefin-base parting agent. The film so coated was dried at 80° C. for 10 minutes in a drier ("SPH-200" trade name; manufactured by Tabai Estec K. K.), whereby a first layer of a first photosensitive resin composition was formed to a thickness of 20 μm. Additional first layers were also formed using the first photosensitive resin compositions A10, A15 and A20, respectively. Similarly, a second layer of the second photosensitive resin composition having a thickness of 25 μm was formed by coating the second photosensitive resin composition B4 onto one side of a 38-μm thick polyethylene terephthalate film, said one side having been treated with a polyolefin-base parting agent, and then drying the resin composition so coated. Additional second layers were also formed using the second photosensitive resin compositions B6, C01 and C02, respectively.

With each of the sample layers obtained from the photosensitive resin composition A05, A10, A15 and A25, respectively, a gradient sensitivity mask whose transmittance varies in 21 stages ranging from 100% to 1% was brought into contact from the side of the polyethylene terephthalate film. The sample layer was exposed at 100, 200, 300 and 500 mJ/cm² to evaluate its sensitivity. The evaluation of the sensitivity was effected by finding out through the mask part of which level of transmittance the part of the sample layer—said part being located between those dissolved by a developer and those undissolved by the developer when the photosensitive resin composition was developed subsequent to its exposure—was exposed.

With respect to the sample layers obtained from B4, B6, C01 and C02, respectively, and those obtained from A05, A10, A15 and A25, respectively, their resin layers were stacked one over the other, followed by further stacking of the gradient sensitivity mask. They were exposed at 100, 200, 300 and 500 mJ/cm² to evaluate their sensitivities.

In the manner described above, the formulations of the first and second photosensitive resin compositions are determined so that the sensitivities of the first and second layers as measured by using the gradient sensitivity mask become equal. As the sensitivity of each photosensitive resin composition to exposure, 6th to 8th levels are preferred from the practical standpoint as the levels of transmittance in the gradient sensitivity mask.

It has been confirmed that, by setting the formulation of the first photosensitive resin composition and the quantity of exposure as shown in Table 3, the first and second layers can be provided with similar sensitivity at the 6th to 8th levels of transmittance.

TABLE 3

| | |
|---|---|
| Amount of "AZ-025" in the 1st photosensitive resin composition (parts by weight): | 0.5 |
| Amount of "Irg" in the 2nd photosensitive resin composition (parts by weight): | 4 |
| Quantity of exposure (mJ/cm²): | 500 |
| Amount of "AZ-025" in the 1st photosensitive resin composition (parts by weight): | 0.5 |
| Amount of "Irg" in the 2nd photosensitive resin composition (parts by weight): | 6 |
| Quantity of exposure (mJ/cm²): | 500 |
| Amount of "AZ-025" in the 1st photosensitive resin composition (parts by weight): | 0.7 |
| Amount of "Irg" in the 2nd photosensitive resin composition (parts by weight): | 0.1 |
| Quantity of exposure (mJ/cm²): | 500 |
| Amount of "AZ-025" in the 1st photosensitive resin composition (parts by weight): | 1.0 |
| Amount of "Irg" in the 2nd photosensitive resin composition (parts by weight): | 0.2 |
| Quantity of exposure (mJ/cm²): | 500 |

The first and second photosensitive resin compositions in Table 3 were coated on a polyethylene terephthalate film and then dried, whereby a photolithographically viahole-forming photosensitive element was fabricated. The total thickness of both the layers was 40 μm. The photolithographically viahole-forming photosensitive element so obtained was laminated at 130° C. on a substrate by a laminator ("Model REL1000", trade name; manufactured by E. I. du Pont de Nemours & Co., Inc.). As the substrate, a copper-clad laminate ("MCL-E-67-1.6t", trade name; product of Hitachi chemical Co., Ltd.) was used.

As is shown in Table 3, viaholes having a minimum diameter of 150 μm was formed by exposing the first and second layers at 500 mJ/cm², peeling off the polyethylene terephthalate film, and then dipping and developing the resultant element for 50 seconds in 1,1,1-trichloroethane whose temperature was controlled at 15° C. All the combinations demonstrated good image formability.

What is claimed is:

1. A photolithographically viahole-forming photosensitive element comprising:

a light-transmitting base material;

a first photosensitive resin composition laminated as a first layer on the light-transmitting base material; and a second photosensitive resin composition laminated as a second layer on the first layer;

wherein said first photosensitive resin composition comprises:

(a) 100 parts by weight of a first mixture comprising:
  (a-1) 10 to 70 parts by weight of a rubber per 100 parts by weight of said first mixture;
  (a-2) 5 to 40 parts by weight of a phenol resin per 100 parts by weight of said first mixture; and
  (a-3) 10 to 80 parts by weight of an epoxy resin per 100 parts by weight of said first mixture;

(b) 0.1 to 10 parts by weight of an epoxy resin photoinitiator per 100 parts by weight of said first mixture; and (c) 0.1 to 10 parts by weight of an aromatic bisazide compound per 100 parts by weight of said first mixture;

and wherein said second photosensitive resin composition comprises:

(d) 100 parts by weight of a second mixture comprising:
  (d-1) 20 to 80 parts by weight of a film-forming polymer per 100 parts by weight of said second mixture, and
  (d-2) 20 to 80 parts by weight of an ethylenically-unsaturated monomer per 100 parts by weight of said second mixture; and (e) 1 to 10 parts by weight of a photopolymerization initiator per 100 parts by weight of said second mixture.

2. A photolithographically viahole-forming photosensitive element as claimed in claim 1, wherein said first photosensitive resin composition further comprise:

(f) 5 to 40 parts by weight of per 100 parts by weight of said first mixture a filler.

3. A photolithographically viahole-forming photosensitive element as claimed in claim 1, wherein said rubber in (a-1) is 30–70 parts by weight per 100 parts by weight of said first mixture.

4. A photolithographically viahole-forming photosensitive element comprising:

a light-transmitting base material;

a first photosensitive resin composition laminated as a first layer on the light-transmitting base material; and a second photosensitive resin composition laminated as a second layer on the first layer;

wherein said first photosensitive resin composition comprises:

(a) 100 parts by weight of a first mixture comprising:
  (a-1) 10 to 90 parts by weight of a rubber per 100 parts by weight of said first mixture;
  (a-2) 10 to 90 parts by weight of a epoxy resin per 100 parts by weight of said first mixture; and (a-3) 0 to 60 parts by weight of an acrylic resin per 100 parts by weight of said first mixture;

(b) 1 to 10 parts by weight of an aromatic bisazide compound per 100 parts by weight of said first mixture;

(c) 1 to 80 parts by weight of a heat-curable crosslinking agent per 100 parts by weight of said first mixture; and (d) 0 to 10 parts by weight of a thermo-polymerization initiator per 100 parts by weight of said first mixture; and wherein said second photosensitive resin composition comprises:

(e) 100 parts by weight of a second mixture comprising:
  (e-1) 20 to 80 parts by weight of a film-forming polymer per 100 parts by weight of said second mixture, and
  (e-2) 20 to 80 parts by weight of an ethylenically-unsaturated monomer per 100 parts by weight of said second mixture; and (f) 1 to 10 parts by weight of a photopolymerization initiator per 100 parts by weight of said second mixture.

5. A photolithographically viahole-forming photosensitive element as claimed in claim 4, wherein said first photosensitive resin composition further comprise:

(g) 5 to 40 parts by weight of per 100 parts by weight of said frist mixture a filler.

* * * * *